(12) United States Patent
Chu et al.

(10) Patent No.: US 12,087,666 B2
(45) Date of Patent: Sep. 10, 2024

(54) SEMICONDUCTOR DEVICE

(71) Applicant: UNITED MICROELECTRONICS CORP., Hsin-Chu (TW)

(72) Inventors: Chung-Liang Chu, Kaohsiung (TW); Yu-Ruei Chen, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/077,168

(22) Filed: Dec. 7, 2022

(65) Prior Publication Data

US 2023/0112835 A1 Apr. 13, 2023

Related U.S. Application Data

(63) Continuation of application No. 17/121,696, filed on Dec. 14, 2020, now Pat. No. 11,552,001, which is a continuation of application No. 16/572,627, filed on Sep. 17, 2019, now Pat. No. 10,903,143.

(30) Foreign Application Priority Data

Aug. 20, 2019 (CN) .......................... 201910767617.9

(51) Int. Cl.
*H01L 23/48* (2006.01)
*H01L 29/78* (2006.01)
*H01L 21/8234* (2006.01)
*H01L 21/8238* (2006.01)

(52) U.S. Cl.
CPC .......... *H01L 23/481* (2013.01); *H01L 29/785* (2013.01); *H01L 21/823431* (2013.01); *H01L 21/823475* (2013.01); *H01L 21/823821* (2013.01); *H01L 21/823871* (2013.01)

(58) Field of Classification Search
CPC ................. H01L 23/481; H01L 29/785; H01L 21/823431; H01L 21/823475; H01L 21/823821; H01L 21/823871; H01L 27/088; H01L 27/0207; H01L 27/092; H01L 27/0924
See application file for complete search history.

(56) References Cited

U.S. PATENT DOCUMENTS

| 8,431,985 B2 | 4/2013 | Hou |
| 9,337,099 B1 | 5/2016 | Jain |
| 10,002,795 B1 | 6/2018 | Bi |
| 10,121,875 B1 | 11/2018 | Ho |

(Continued)

FOREIGN PATENT DOCUMENTS

| CN | 106057807 A | 10/2016 |
| CN | 109801961 A | 5/2019 |

*Primary Examiner* — Cuong B Nguyen
(74) *Attorney, Agent, or Firm* — Winston Hsu

(57) ABSTRACT

A semiconductor device includes a substrate, an isolation structure, a first gate structure, a second gate structure, a first slot contact structure, a first gate contact structure, and a second gate contact structure. The substrate includes a first active region and a second active region elongated in a first direction respectively. The first gate structure, the second gate structure, and the first slot contact structure are continuously elongated in a second direction respectively. The first gate contact structure and the second gate contact structure are disposed at two opposite sides of the first slot contact structure in the first direction respectively.

19 Claims, 10 Drawing Sheets

(56) References Cited

U.S. PATENT DOCUMENTS

| | | |
|---|---|---|
| 10,553,707 B1 | 2/2020 | Shen |
| 2013/0292773 A1 | 11/2013 | Wang |
| 2014/0339610 A1 | 11/2014 | Rashed |
| 2015/0255123 A1* | 9/2015 | Paak .................. G11C 8/14 |
| | | 365/51 |
| 2016/0268244 A1* | 9/2016 | Young ............ H01L 21/823437 |
| 2017/0092638 A1 | 3/2017 | Jung |
| 2018/0158811 A1 | 6/2018 | Subhash |
| 2018/0301559 A1 | 10/2018 | Liaw |
| 2019/0096870 A1 | 3/2019 | Liaw |
| 2019/0131171 A1 | 5/2019 | Gwak |
| 2019/0172841 A1 | 6/2019 | Kishishita |
| 2019/0220568 A1 | 7/2019 | Ryu |
| 2019/0259670 A1 | 8/2019 | Zhuang |
| 2019/0378722 A1 | 12/2019 | Economikos |
| 2020/0006149 A1 | 1/2020 | Liaw |
| 2020/0097632 A1 | 3/2020 | Lin |
| 2020/0098750 A1 | 3/2020 | Lin |
| 2020/0135569 A1 | 4/2020 | Liaw |
| 2020/0203231 A1 | 6/2020 | Hsu |
| 2020/0219970 A1 | 7/2020 | Mannebach |
| 2020/0219979 A1 | 7/2020 | Rachmady |
| 2020/0266072 A1 | 8/2020 | Lie |

\* cited by examiner

SEMICONDUCTOR DEVICE

CROSS REFERENCE TO RELATED APPLICATIONS

This application is a continuation application of U.S. application Ser. No. 17/121,696, filed on Dec. 14, 2020, which is a continuation application of U.S. application Ser. No. 16/572,627, filed on Sep. 17, 2019. The contents of these applications are incorporated herein by reference.

BACKGROUND OF THE INVENTION

1. Field of the Invention

The present invention relates to a semiconductor device, and more particularly, to a semiconductor device including a slot contact structure.

2. Description of the Prior Art

Standard cells are composed of a set or a plurality of transistors which are connected to one another, being used to execute Boolean logic functions (such as AND, OR, XOR or XNOR) or can provide storage functions (as a flip-flop or a latch). With the advanced process technology, such as Fin-FET transistor, the layout design of the standard cells can be various. However, it would be beneficial to the layout design and/or the electrical performance of the integrate circuits by shrinking the area occupied by the standard cell. Accordingly, the method of reducing the occupied area of the standard cell by modifying the layout design in the standard cell is important for the related industries.

SUMMARY OF THE INVENTION

It is one of the objectives of the present invention to provide a semiconductor device. Gate contact structures are disposed adjacent to a slot contact structure for reducing the size of the semiconductor device.

A semiconductor device is provided in an embodiment of the present invention. The semiconductor device includes a substrate, an insolation structure, a first gate structure, a second gate structure, a first slot contact structure, a first gate contact structure, and a second gate contact structure. The substrate includes a first active region and a second active region. The first active region and the second active region are elongated in a first direction respectively. The isolation structure is disposed between the first active region and the second active region. The first gate structure, the second gate structure, and the first slot contact structure are continuously elongated in a second direction respectively and disposed on the first active region, the second active region, and the isolation structure. The first slot contact structure is disposed between the first gate structure and the second gate structure in the first direction. The first gate contact structure is disposed on and electrically connected with the first gate structure. The second gate contact structure is disposed on and electrically connected with the second gate structure. The first gate contact structure and the second gate contact structure are disposed at two opposite sides of the first slot contact structure in the first direction respectively.

These and other objectives of the present invention will no doubt become obvious to those of ordinary skill in the art after reading the following detailed description of the preferred embodiment that is illustrated in the various figures and drawings.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The term "etch" is used herein to describe the process of patterning a material layer so that at least a portion of the material layer after etching is retained. For example, it is to be understood that the method of etching silicon involves patterning a photoresist layer over silicon and then removing silicon from the area that is not protected by the photoresist layer. Thus, after the etching process is complete, the silicon protected by the area of the photoresist layer will remain. In another example, the term "etch" may also refer to a method that does not use a photoresist, but leaves at least a portion of the material layer after the etch process is complete.

The above description may be used to distinguish between "etching" and "removal". When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
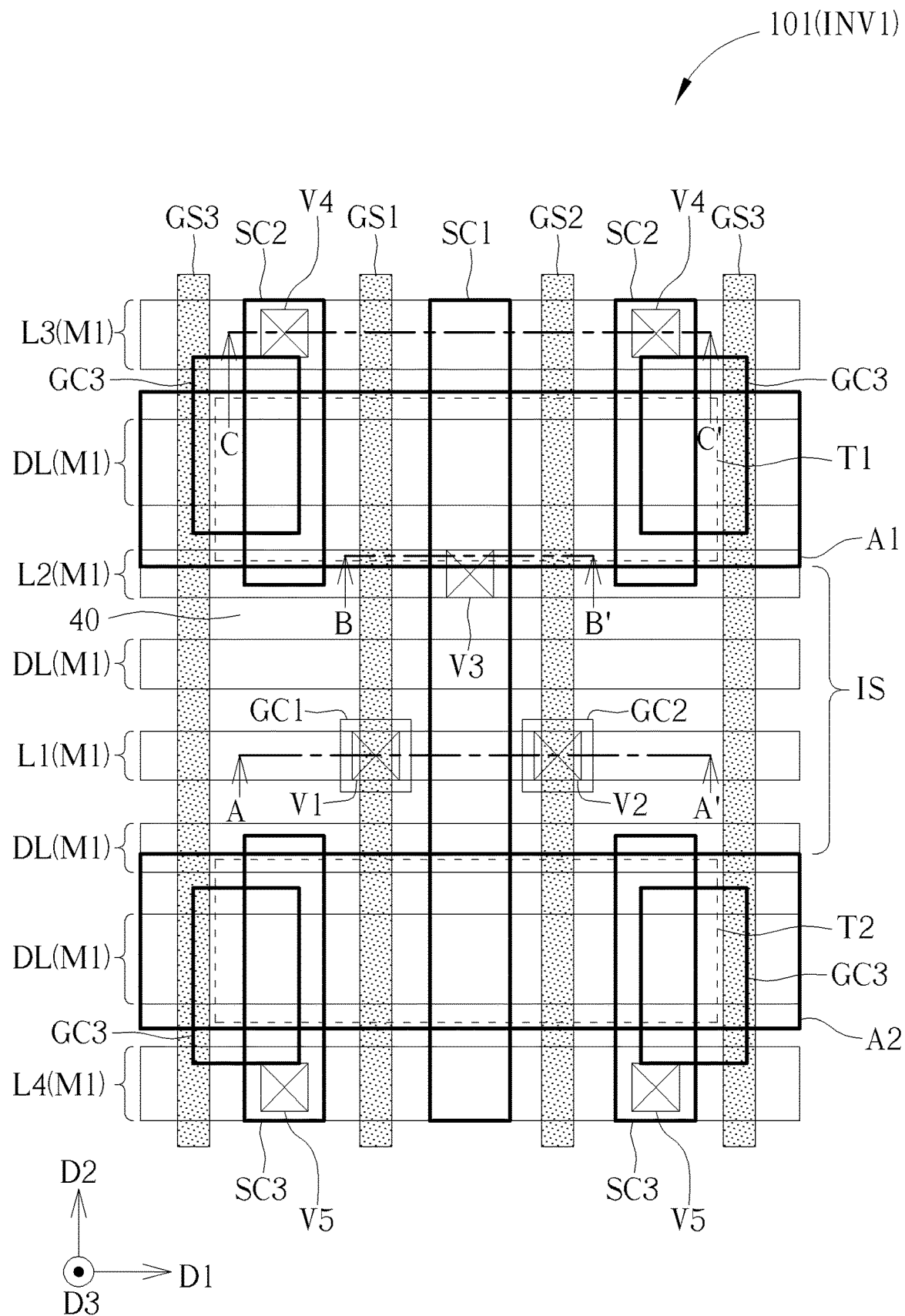
FIG. 1 is a top view schematic drawing illustrating a semiconductor device according to a first embodiment of the present invention.
Figure 2:
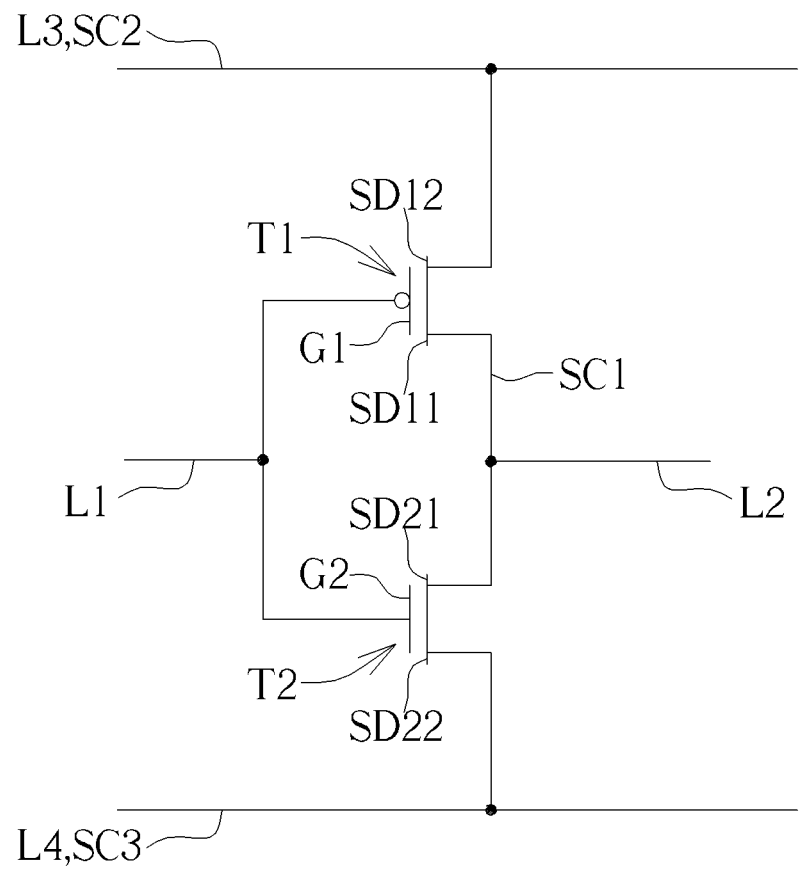
FIG. 2 is a schematic circuit diagram of the semiconductor device according to the first embodiment of the present invention.
Figure 3:
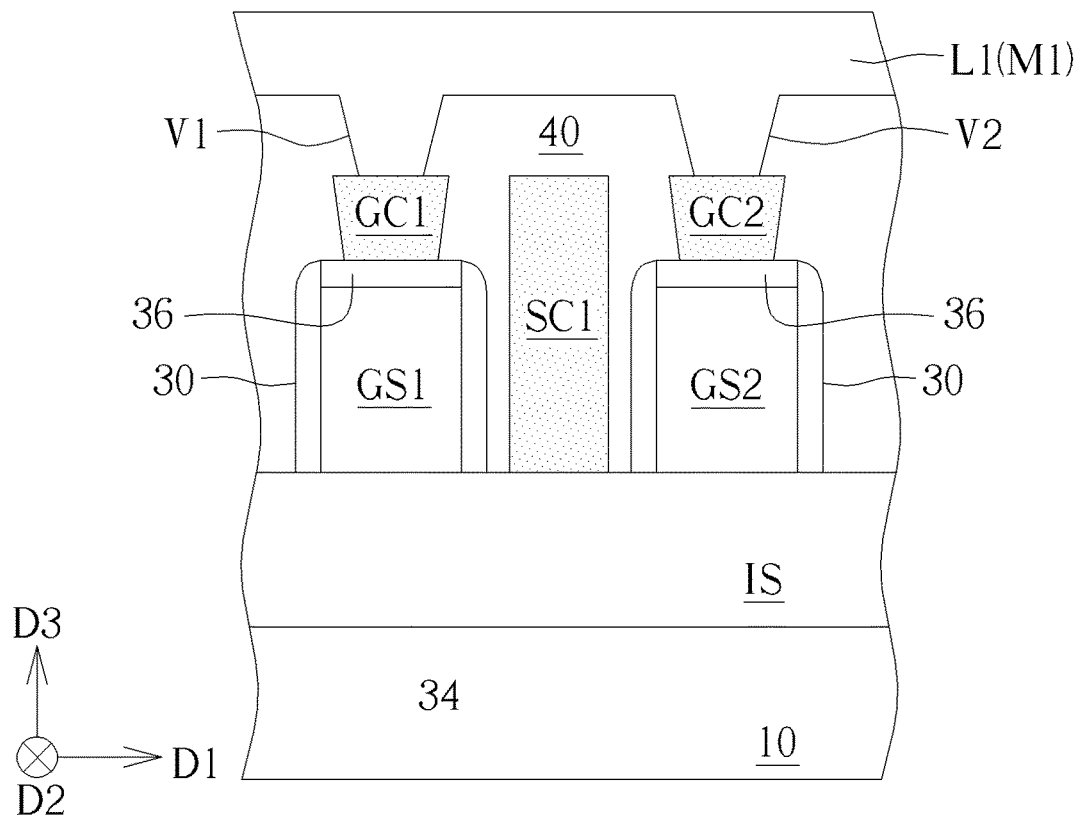
FIG. 3 is a cross-sectional diagram taken along a line A-A' in FIG. 1.
Figure 4:
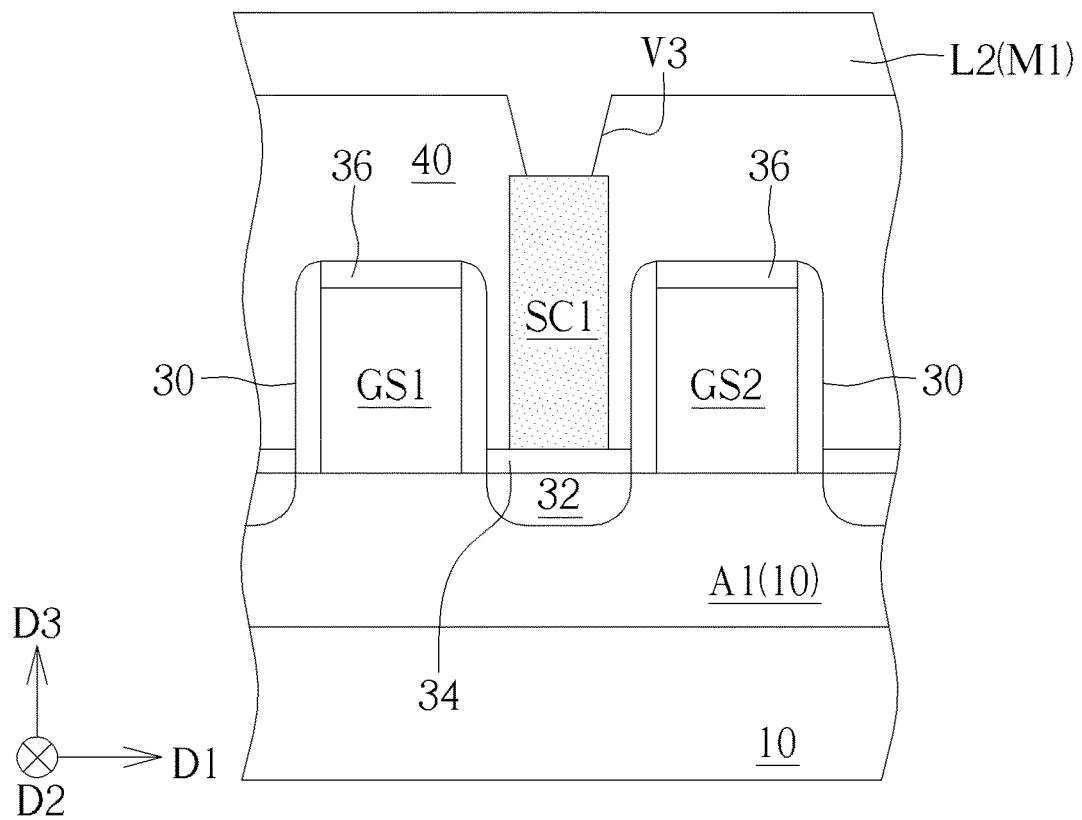
FIG. 4 is a cross-sectional diagram taken along a line B-B' in FIG. 1.
Figure 5:
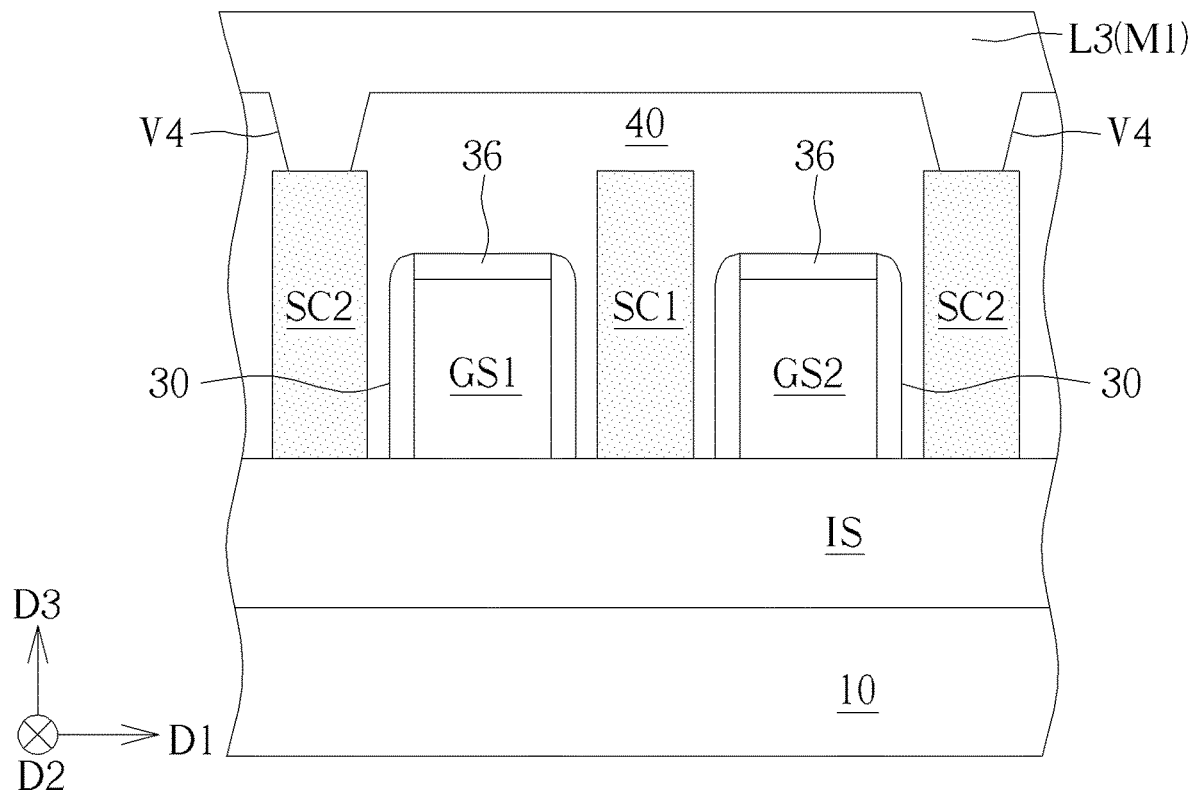
FIG. 5 is a cross-sectional diagram taken along a line C-C' in FIG. 1.

Please refer to FIGS. 1-5. FIG. 1 is a top view schematic drawing illustrating a semiconductor device according to a first embodiment of the present invention, FIG. 2 is a schematic circuit diagram of the semiconductor device in this embodiment, FIG. 3 is a cross-sectional diagram taken along a line A-A' in FIG. 1, FIG. 4 is a cross-sectional diagram taken along a line B-B' in FIG. 1, and FIG. 5 is a cross-sectional diagram taken along a line C-C' in FIG. 1. As shown in FIG. 1 and FIGS. 3-5, a semiconductor device 101 is provided in this embodiment. The semiconductor device 101 includes a substrate 10, an insolation structure IS, a first gate structure GS1, a second gate structure GS2, a first slot contact structure SC1, a first gate contact structure GC1, and a second gate contact structure GC2. The substrate 10 includes a first active region A1 and a second active region A2. The first active region A1 and the second active region A2 are elongated in a first direction D1 respectively. The isolation structure IS is disposed between the first active region A1 and the second active region A2. The first gate structure GS1, the second gate structure GS2, and the first slot contact structure SC1 are elongated in a second direction D2 respectively, and the first gate structure GS1, the second gate structure GS2, and the first slot contact structure SC1 are disposed on the first active region A1, the second active region A2, and the isolation structure IS. The first slot contact structure SC1 is disposed between the first gate structure GS1 and the second gate structure GS2 in the first direction D1. The first gate contact structure GC1 is disposed on and electrically connected with the first gate structure GS1. The second gate contact structure GC2 is disposed on and electrically connected with the second gate structure GS2. The first gate contact structure GC1 and the second gate contact structure GC2 are disposed at two opposite sides of the first slot contact structure SC1 in the first direction D1 respectively, and the first gate contact structure GC1 and the second gate contact structure GC2 are disposed between the first active region A1 and the second active region A2 in the second direction D2. A length of the first gate contact structure GC1 in the second direction D2 and a length of the second gate contact structure GC2 in the second direction D2 are less than a length of the isolation structure IS in the second direction D2. By disposing the first gate contact structure GC1 and the second gate contact structure GC2 at the two opposite sides of the first slot contact structure SC1, the layout design of the semiconductor device 101 may be simplified and/or the area occupied by the semiconductor device 101 may be reduced accordingly.

Specifically, in some embodiments, the substrate 10 may include a semiconductor substrate, such as a silicon substrate, an epitaxial substrate, a silicon germanium substrate, a silicon carbide substrate, or a silicon-on-insulator (SOI) substrate, but not limited thereto. The isolation structure IS may be formed of a single layer or multiple layers of insulation material, such as silicon nitride, silicon oxynitride, silicon carbonitride, or other suitable insulation materials. The isolation structure IS may include a shallow trench isolation (STI) structure or other suitable isolation structures configured to define a plurality of active regions separated from one another (such as the first active region A1 and the second active region A2) in the substrate 10. In other words, the first active region A1 and the second active region A2 may respectively include a semiconductor material in the substrate 10, but not limited thereto. Additionally, in some embodiments, the first active region A1 and the second active region A2 may be a fin-shaped structure extending upwards from the substrate 10 respectively, and the isolation structure IS may be disposed between the fin-shaped structures adjacent to each other. In some embodiments, the first active region A1 and the second active region A2 may be elongated in the first direction D1, and the isolation structure IS may be located between the first active region A1 and the second active region A2 in the second direction D2. The first direction D1 and the second direction D2 may be substantially orthogonal to each other, but not limited thereto.

In some embodiments, the first gate structure GS1 and the second gate structure GS2 may include a gate material and a gate dielectric layer (not shown in FIGS. 1-5) located between the gate material and the substrate 10. The gate material may include a metallic material a non-metallic material (such as polysilicon), or other suitable conductive materials, and the gate dielectric layer may include an oxide layer, such as a silicon oxide layer, or other suitable dielectric materials, such as a high dielectric constant dielectric material. In addition, a spacer 30 may be formed on a sidewall of the first gate structure GS1 and a sidewall of the second gate structure GS2, and a source/drain region may be formed in the active region located between the first gate structure GS1 and the second gate structure GS2. In some embodiments, the spacer 30 may include a single layer or multiple layers of insulation material, such as silicon nitride, silicon oxynitride, silicon carbonitride, or other suitable insulation materials. The source/drain region described above may include a doped region, an epitaxial structure (such as an epitaxial structure 32 shown in FIG. 4), or other suitable source/drain structures. In addition, a silicide layer 34 may be formed on the source/drain region and a silicide layer 36 may be formed on the first gate structure GS1 and the second gate structure GS2, but not limited thereto. The silicide layer 34 and the silicide layer 36 may include a conductive metal silicide material, such as cobalt-silicide, nickel-silicide, or other suitable metal silicide. The silicide layer 34 may be located between the first slot contact structure SC1 and the epitaxial structure 32, and the first slot contact structure SC1 may be electrically connected with the epitaxial structure 32 via the silicide layer 34. The silicide layer 36 may be disposed between the first gate contact structure GC1 and the first gate structure GS1 and disposed between the second gate contact structure GC1 and the second gate structure GS2. The first gate contact structure GC1 may be electrically connected with the first gate structure GS1 via the silicide layer 36, and the second gate contact structure GC2 may be electrically connected with the second gate structure GS2 via the silicide layer 36.

In some embodiments, the first gate contact structure GC1, the second gate contact structure GC2, and the first slot contact structure SC1 may respectively include a barrier layer (not shown) and a conductive material (not shown) disposed on the barrier layer, but not limited thereto. In some embodiments, other suitable types of conductive structures may also be used in the first gate contact structure GC1, the second gate contact structure GC2, and the first slot contact structure SC1. The barrier layer mentioned above may include titanium nitride, tantalum nitride, or other suitable barrier materials, and the conductive material mentioned above may include a material with relatively lower resistivity, such as copper, aluminum, and tungsten, but not limited thereto. In some embodiments, a distance between the first gate contact structure GC1 and the first slot contact structure SC1 in the first direction D1 and a distance between the second gate contact structure GC2 and the first slot contact structure SC1 in the first direction D1 may be less than or equal to 12 nanometers for reducing the area occupied by the semiconductor device 101 as much as possible. Additionally, the first gate contact structure GC1 and the second gate contact structure GC2 do not overlap the first active region A1 and the second active region A2 in a thickness direction of the substrate 10 (such as a third direction D3). In other words, the first gate contact structure GC1 disposed adjacent to the first slot contact structure SC1 and the second gate contact structure GC2 disposed adjacent to the first slot contact structure SC1 may be disposed above the isolation structure IS without being disposed on the active regions. In some embodiments, there may be not any active region disposed between the first active region A1 and the second active region A2, and the isolation structure IS and other parts disposed thereon may be located between the first active region A1 and the second active region A2 only.

In some embodiments, the semiconductor device 101 may further include a dielectric layer 40, a first opening (such as an opening V1), a second opening (such as an opening V2), an opening V3, a first conductive line (such as a conductive line L1), and a conductive line L2. The dielectric layer 40 is disposed on the first gate contact structure GC1, the second gate contact structure GC2, and the first slot contact structure SC1. The dielectric layer 40 may include a single layer or multiple layers of dielectric material, such as silicon oxide, silicon nitride, silicon oxynitride, or other suitable dielectric materials, and the conductive lines may include a conductive material with relatively lower resistivity, such as copper, aluminum, and tungsten, but not limited thereto. The opening V1 may penetrate the dielectric layer 40 on the first gate contact structure GC1 and expose a part of the first gate contact structure GC1, the opening V2 may penetrate the dielectric layer 40 on the second gate contact structure GC2 and expose a part of the second gate contact structure GC2, and the opening V3 may penetrate the dielectric layer 40 on the first slot contact structure SC1 and expose a part of the first slot contact structure SC1. Additionally, the conductive line L1 and the conductive line L2 may be disposed on the dielectric layer 40 and elongated in the first direction D1 respectively. A part of the conductive line L1 may be disposed on the first gate contact structure GC1, and the conductive line L1 may be electrically connected with the first gate contact structure GC1 via the opening V1. Additionally, in some embodiments, another part of the conductive line L1 may be disposed on the second gate contact structure GC2, the conductive line L1 may be electrically connected with the second gate contact structure GC2 via the opening V2, and the first gate structure GS1 may be electrically connected with the second gate structure GS2 by the first gate contact structure GC1, the conductive line L1, and the second gate contact structure GC2. A part of the conductive line L2 may be disposed on the first slot contact structure SC1, and the conductive line L2 may be electrically connected with the first slot contact structure SC1 via the opening V3. In some embodiments, the conductive lines mentioned above (such as the conductive line L1 and the conductive line L2) may be partly disposed in the openings (such as the opening V1, the opening V2, and the opening V3), or connection plus (not shown) may be formed in the openings, and the conductive lines may be electrically connected with the gate contact structures or the slot contact structures by the connection plugs, but not limited thereto.

In some embodiments, the semiconductor device 101 may further include two third gate structures GS3, four third gate contact structures GC3, two second slot contact structure SC2, two third slot contact structures SC3, two openings V4, two openings V5, a conductive line L3, a conductive line L4, and a plurality of dummy conductive lines DL. Each of the third gate structures GS3 may be elongated in the second direction D2 and disposed on the first active region A1, the second active region A2, and the isolation structure IS. In some embodiments, the two third gate structures GS3 may be located at two ends of the semiconductor device 101 in the first direction D1, and the third gate structures GS3 may be regarded as dummy gate structures, but not limited thereto. In some embodiments, the first gate structure GS1, the second gate structure GS2, and the third gate structures GS3 may be formed concurrently by the same manufacturing process and have the same composition, the same width, and equal spacing, but not limited thereto. The third gate contact structure GC3 may be partly disposed on and electrically connected with the third gate structure GS3. In some embodiments, the third gate contact structure GC3, the first gate contact structure GC1, and the second gate contact structure GC2 may be formed concurrently by the same manufacturing process, and the compositions of the first gate contact structure GC1, the second gate contact structure GC2, and the third gate contact structure GC3 may be identical to one another, but not limited thereto. Each of the second slot contact structures SC2 may be elongated in the second direction D2 and at least partially disposed on the first active region A1, and each of the third slot contact structures SC3 may be elongated in the second direction D2 and at least partially disposed on the second active region A2. The two second slot contact structures SC2 may be disposed between the third gate structure GS3 and the first gate structure GS1 in the first direction D1 and be disposed between the third gate structure GS3 and the second gate structure GS2 in the first direction D1 respectively. The two third slot contact structures SC3 may be disposed between the third gate structure GS3 and the first gate structure GS1 in the first direction D1 and be disposed between the third gate structure GS3 and the second gate structure GS2 in the first direction D1 respectively. In addition, a length of the second slot contact structure SC2 in the second direction D2 and a length of the third slot contact structure SC3 in the second direction D2 may be respectively less than a length of the first slot contact structure SC1 in the second direction D2.

Additionally, the dielectric layer 40 mentioned above may be further disposed on the third gate contact structures GC3, the second slot contact structures SC2, and the third slot contact structures SC3. Two openings V4 may penetrate the dielectric layer 40 on the second slot contact structures SC2 respectively, and two openings V5 may penetrate the dielectric layer 40 on the third slot contact structures SC3 respectively. The conductive line L3 may be electrically connected with the second slot contact structures SC2 via the openings V4, and the conductive line L4 may be electrically connected with the third slot contact structures SC3 via the openings V5. By the layout design of this embodiment, the conductive line L1, the conductive line L2, the conductive line L3, and the conductive line L4 mentioned above may be elongated in the first direction D1 respectively and disposed parallel to one another. In addition, the dummy conductive lines DL may be disposed between the conductive line L1, the conductive line L2, the conductive line L3, and the conductive line L4 according to some considerations, and the dummy conductive lines DL may be electrically floating or be connected to a voltage source according to the design considerations. In some embodiments, the conductive line L1, the conductive line L2, the conductive line L3, the conductive line L4, and the dummy conductive lines DL may be formed concurrently by the same manufacturing process and have the same composition (may be a part of a patterned conductive layer MI respectively, for example), but not limited thereto. It is worth noting that a multiple patterning process, such as a self-aligned double patterning (SADP) process may be used to form the conductive line L1, the conductive line L2, the conductive line L3, the conductive line L4, and the dummy conductive lines DL with smaller spacing therebetween because the conductive line L1, the conductive line L2, the conductive line L3, the conductive line L4, and the dummy conductive lines DL may be elongated in the same direction, and the occupied area of the semiconductor device 101 may be reduced by this approach.

In addition, the layout design of the semiconductor device 101 shown in FIG. 1 may be regarded as a standard cell, and one or more transistor structures may be included in this standard cell for providing required operation performance. As shown in FIGS. 1-5, in some embodiments, the first gate structure GS1 disposed on the first active region A1 and the second gate structure GS2 disposed on the first active region A1 may be a gate electrode G1 of a first transistor T1, the first gate structure GS1 disposed on the second active region A2 and the second gate structure GS2 disposed on the second active region A2 may be a gate electrode G2 of a second transistor T2, and the gate electrode G1 of the first transistor T1 may be electrically connected with the gate electrode G2 of the second transistor T2 by the first gate structure GS1 disposed on the isolation structure IS and the second gate structure GS2 disposed on the isolation structure IS. Additionally, the first slot contact structure SC may be electrically connected with a first source/drain region SD11 (such as the epitaxial region 32 described above) of the first transistor T1 and a first source/drain region SD21 (such as an epitaxial region formed in the second active region A2, not shown) of the second transistor T2. The second slot contact structure SC2 may be electrically connected with a second source/drain region SD12 (such as another epitaxial region 32 formed in the first active region A1) of the first transistor T1. The third slot contact structure SC3 may be electrically connected with a second source/drain region SD12 (such as another epitaxial region formed in the second active region A2, not shown) of the second transistor T2. In some embodiments, the semiconductor device 101 may be regarded as an inverter, such as a first inverter INV1, the first transistor T1 may be a P-type transistor in the first inverter INV1, and the second transistor T2 may be an N-type transistor in the first inverter INV1, but not limited thereto.

As shown in FIG. 1, in some embodiments, the length of the first gate contact structure GC1 in the second direction D2 may be substantially equal to a length of the first gate contact structure GC1 in the first direction D1, and the length of the second gate contact structure GC2 in the second direction D2 may be substantially equal to a length of the second gate contact structure GC2 in the first direction D1. In other words, the shape of the first gate contact structure GC1 and the shape of the second gate contact structure GC2 in a top view diagram of the semiconductor device 101 may be square, round, or other suitable shapes. In addition, the length of the first gate contact structure GC1 in the second direction D2 and the length of the second gate contact structure GC2 in the second direction D2 may be less than a pitch between the conductive line L1 and the dummy conductive line DL in the second direction D2. The pitch described above may be equal to the sum of the spacing between the conductive line L1 and the dummy conductive line DL adjacent to the conductive line L1 and the width of the conductive line L1 in the second direction D2, but not limited thereto. In other words, the dummy conductive line DL disposed adjacent to the conductive line L1 does not overlap the first gate contact structure GC1 and the second gate contact structure GC2 in the third direction D3.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 6:
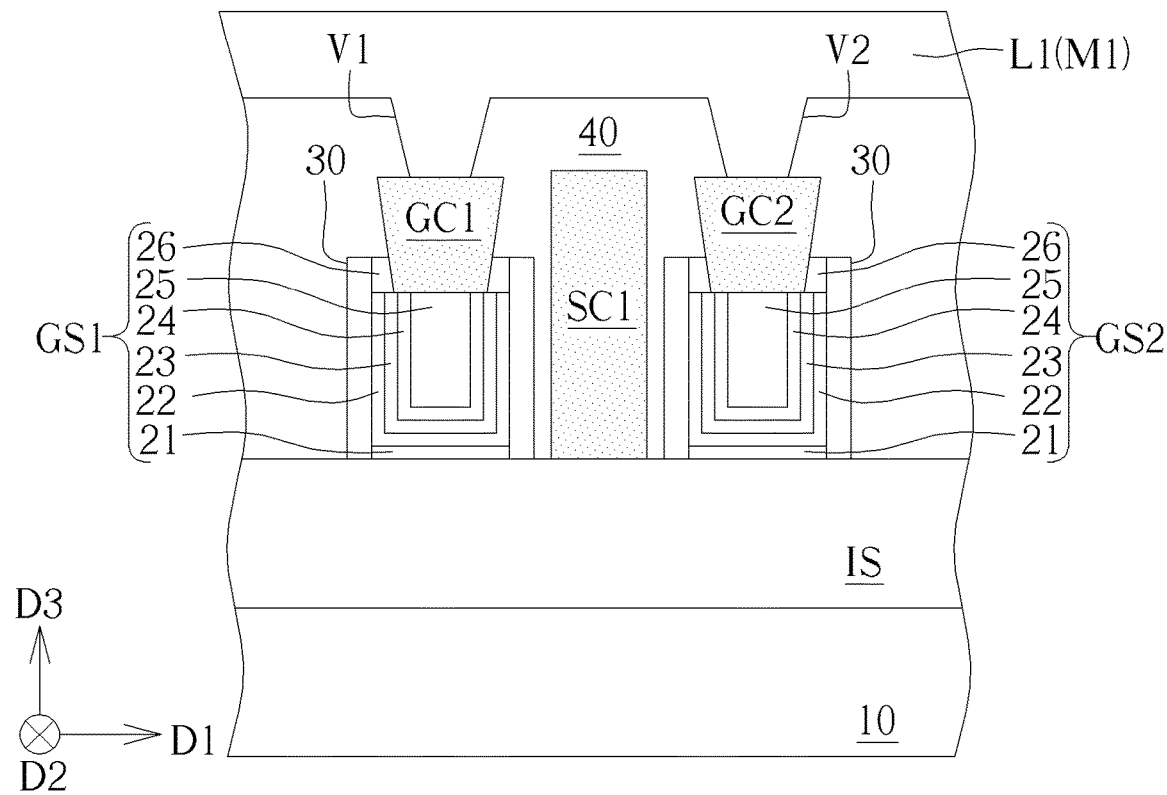
FIG. 6 is a schematic drawing illustrating a semiconductor device according to another embodiment of the present invention.

Please refer to FIG. 6. FIG. 6 is a schematic drawing illustrating a semiconductor device according to another embodiment of the present invention. As shown in FIG. 6, the difference between the semiconductor device in this embodiment and the semiconductor device in the first embodiment described above is that the first gate structure GS1 and the second gate structure GS2 in this embodiment may respectively include an interfacial layer 21, a gate dielectric layer 22, a barrier layer 23, a work function layer 24, a gate material layer 25, and a gate capping layer 26. The interfacial layer 21 may include silicon oxide or other suitable dielectric materials. The gate dielectric layer 22 may include a high dielectric constant (high-k) dielectric layer, such as hafnium oxide ($HfO_2$), hafnium silicon oxide ($HfSiO_4$), hafnium silicon oxynitride (HfSiON), aluminum oxide ($Al_2O_3$), tantalum oxide ($Ta_2O_5$), zirconium oxide ($ZrO_2$), or other suitable high-k materials. The barrier layer 23 and the work function layer 24 may respectively include tantalum nitride (TaN), titanium nitride (TiN), titanium carbide (TIC), titanium aluminide (TiAl), titanium aluminum carbide (TiAlC), or other suitable N-type work function materials and/or P-type work function materials. The gate material layer 25 may include a low resistivity metallic material, such as aluminum, tungsten, copper, titanium aluminide, or other suitable metallic conductive materials having relatively lower resistivity. The gate capping layer 26 may include silicon nitride, silicon carbonitride, or other suitable insulation materials. It is worth noting that the above-mentioned compositions of the first gate structure GS1 and the second structure GS2 in this embodiment may also be applied to other embodiments of the present invention according to some considerations.

Figure 7:
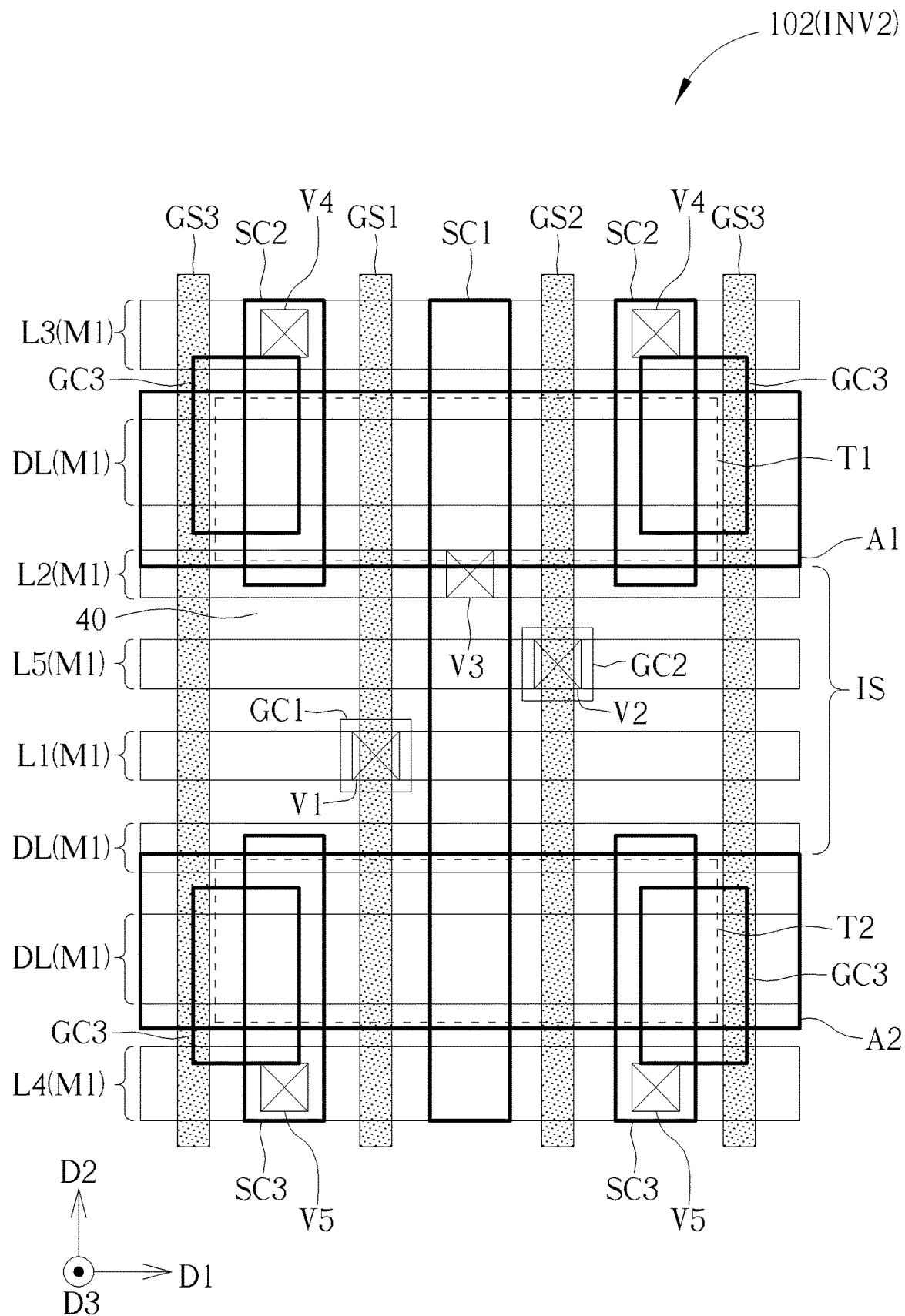
FIG. 7 is a schematic drawing illustrating a semiconductor device according to a second embodiment of the present invention.

Please refer to FIG. 7. FIG. 7 is a schematic drawing illustrating a semiconductor device 102 according to a second embodiment of the present invention. As shown in FIG. 7, the difference between the semiconductor device 102 in this embodiment and the semiconductor device in the first embodiment described above is that the first gate contact structure GC1 and the second gate contact structure GC2 in this embodiment may be arranged misaligned with each other in the first direction D1. In other words, the first gate contact structure GC1 may not be flush with the second gate contact structure GC2 in the first direction D1 for reducing negative influence generated by the extremely short distance between the first gate contact structure GC1 and the first slot contact structure SC1 and the extremely short distance between the second gate contact structure GC2 and the first slot contact structure SC1 in this embodiment. Additionally, the semiconductor device 102 in this embodiment may further include a second conductive line (such as a conductive line L5) disposed on the dielectric layer 40 and elongated in the first direction D1. A part of the conductive line L5 may be disposed on the second gate contact structure GC2, and the conductive line L5 may be electrically connected with the second gate contact structure GC2 via the opening V2. In other words, the first gate contact structure GC1 and the second gate contact structure GC2 in this embodiment may be arranged misaligned with each other in the first direction D1, and the first gate contact structure GC1 and the second gate contact structure GC2 may be electrically connected with different conductive lines respectively. It is worth noting that, the standard cell area of the semiconductor device 102 shown in FIG. 7 may not be influenced by the first gate contact structure GC1 and the second gate contact structure GC2 arranged misaligned with each other in the first direction D1 because the area of the first gate contact structure GC and the area of the second gate contact structure GC2 in the top view of the semiconductor device 102 are relatively smaller. In some embodiments, the length of the first gate contact structure GC1 in the second direction D2 and the length of the second gate contact structure GC2 in the second direction D2 may be less than a pitch between the conductive line L1 and the conductive line L5 in the second direction D2. The pitch described above may be equal to the sum of the spacing between the conductive line L1 and the conductive line L5 and the width of the conductive line L1 in the second direction D2, or the pitch described above may be equal to the sum of the spacing between the conductive line L1 and the conductive line L5 and the width of the conductive line L5 in the second direction D2, but not limited thereto. In some embodiments, the semiconductor device 102 may be regarded as an inverter, such as a second inverter INV2, but not limited thereto.

Figure 8:
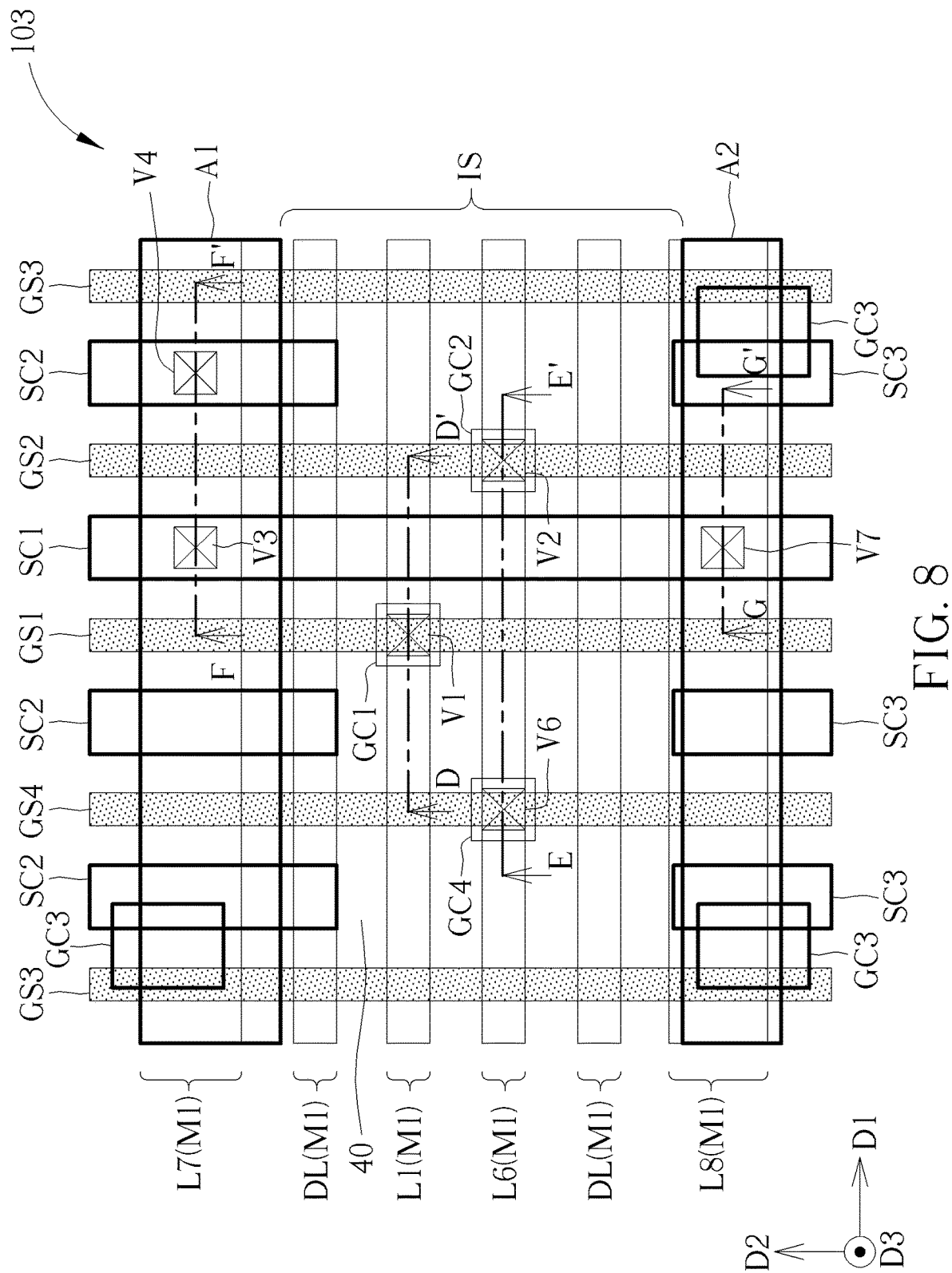
FIG. 8 is a top view schematic drawing illustrating a semiconductor device according to a third embodiment of the present invention.
Figure 9:
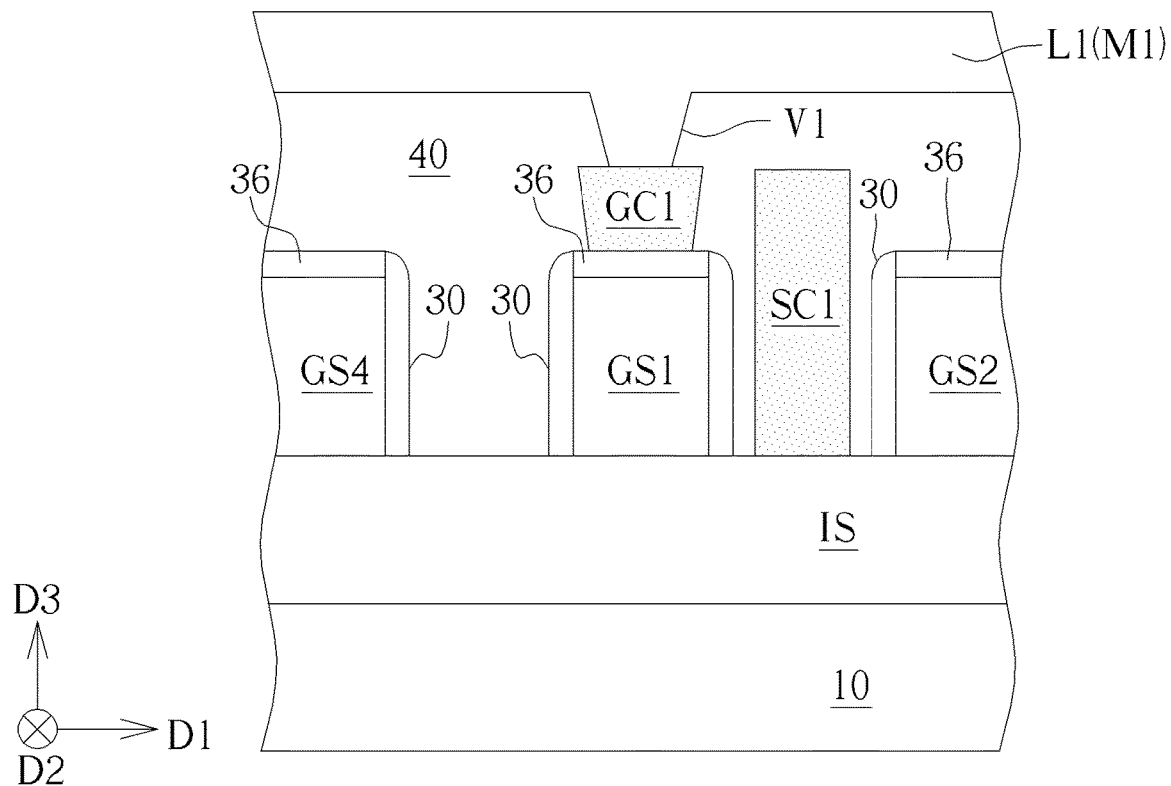
FIG. 9 is a cross-sectional diagram taken along a line D-D' in FIG. 8.
Figure 10:
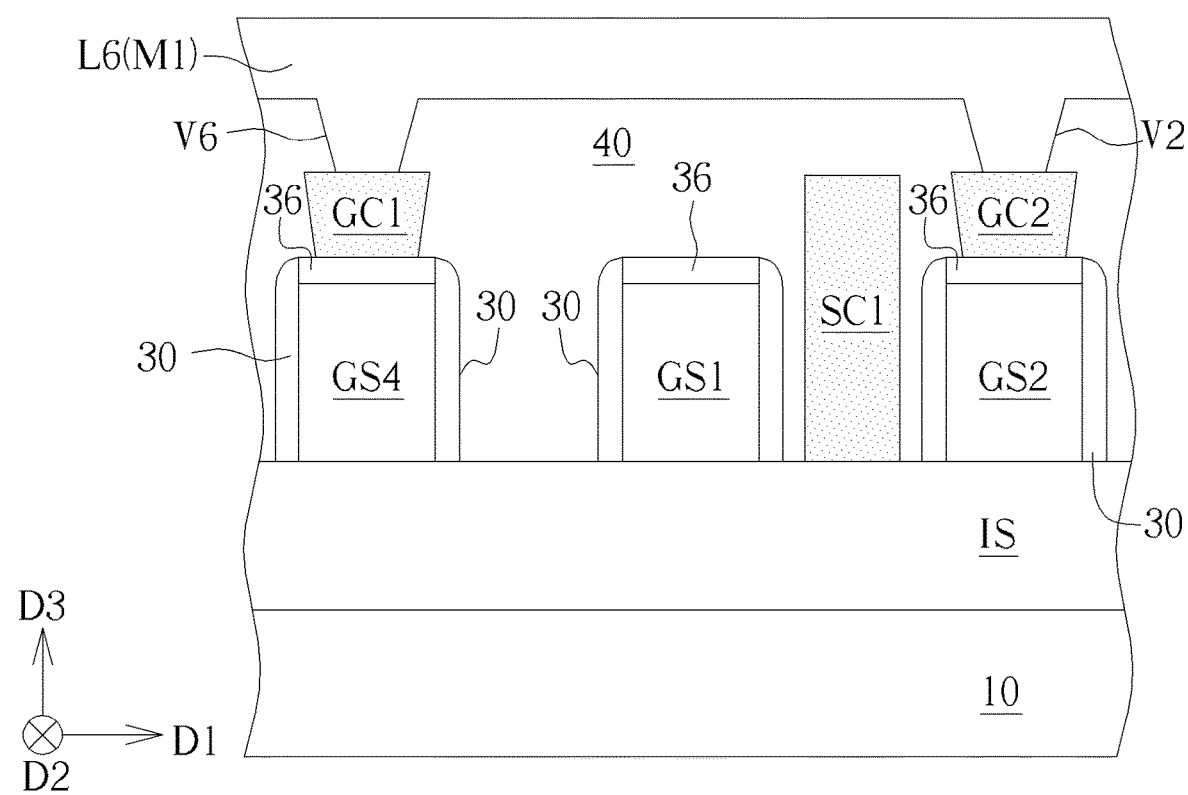
FIG. 10 is a cross-sectional diagram taken along a line E-E' in FIG. 8.
Figure 11:
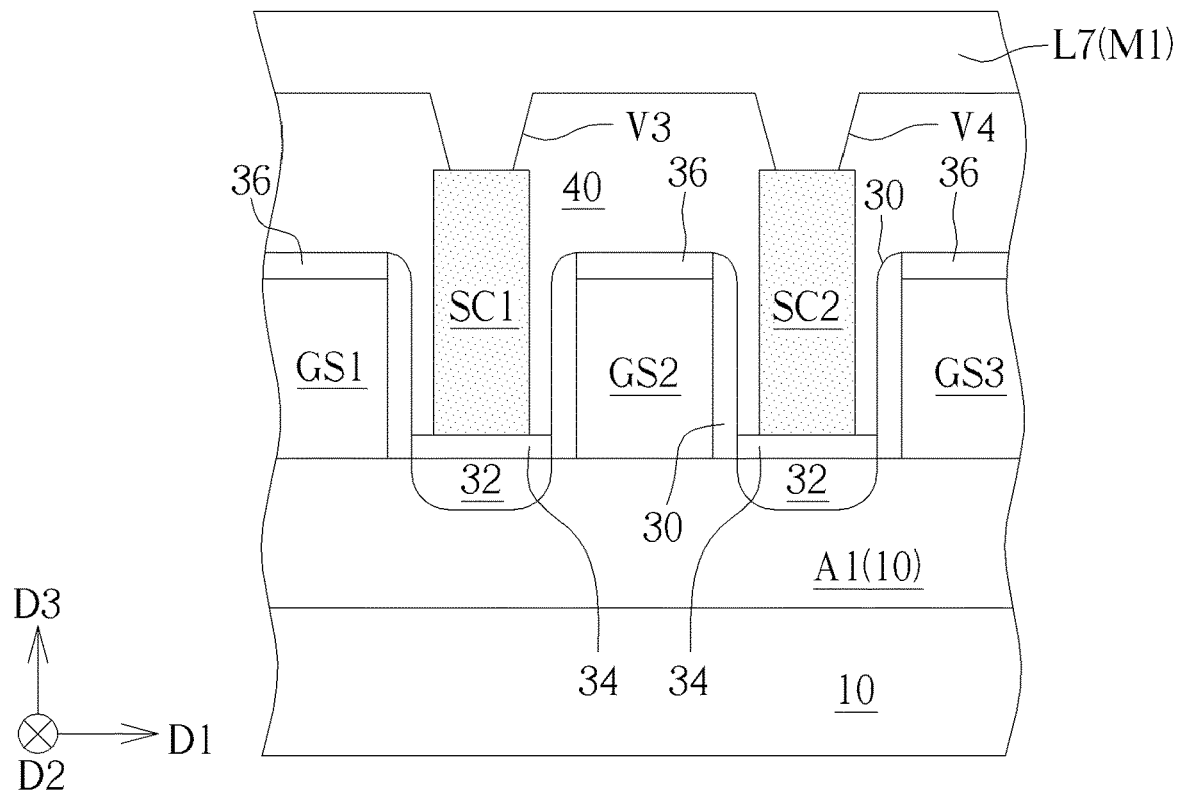
FIG. 11 is a cross-sectional diagram taken along a line F-F' in FIG. 8.
Figure 12:
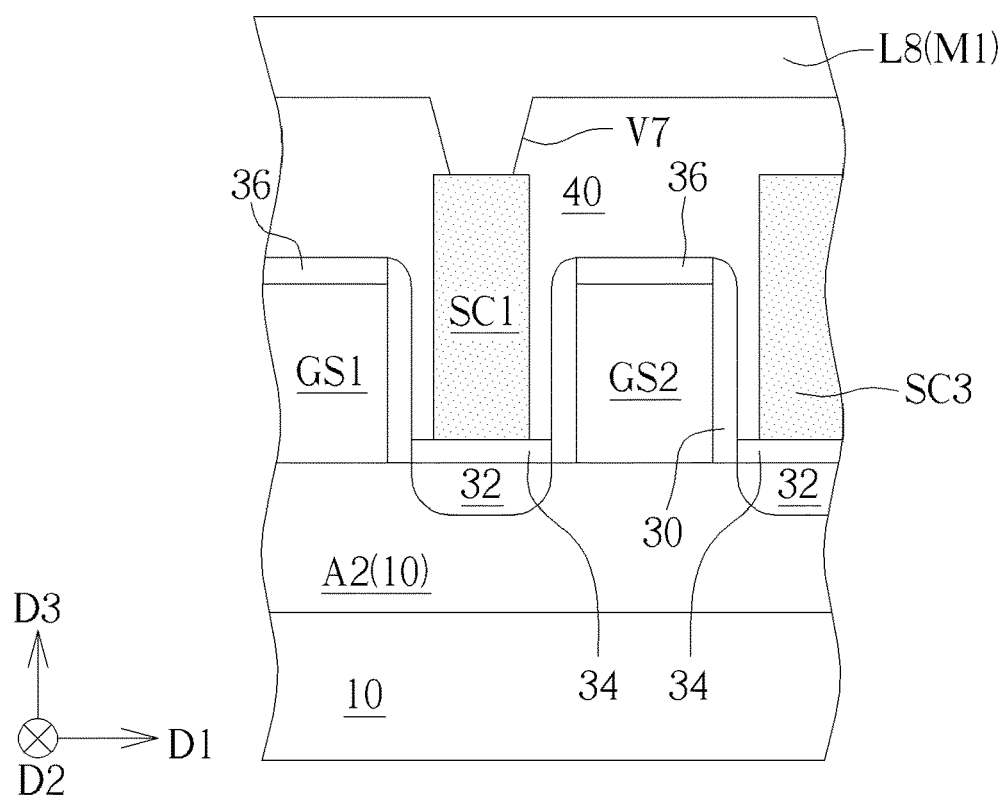
FIG. 12 is a cross-sectional diagram taken along a line G-G' in FIG. 8.

Please refer to FIGS. 8-12. FIG. 8 is a top view schematic drawing illustrating a semiconductor device 103 according to a third embodiment of the present invention, FIG. 9 is a cross-sectional diagram taken along a line D-D' in FIG. 8, FIG. 10 is a cross-sectional diagram taken along a line E-E' in FIG. 8, FIG. 11 is a cross-sectional diagram taken along a line F-F' in FIG. 8, and FIG. 12 is a cross-sectional diagram taken along a line G-G' in FIG. 8. As shown in FIGS. 8-12, the difference between the semiconductor device 103 in this embodiment and the semiconductor device in the second embodiment described above is that the semiconductor device 103 may further include a fourth gate structure GS4, a fourth gate contact structure GC4, a conductive line L6, a conductive line L7, a conductive line L8, an opening V6, and an opening V7. The fourth gate structure GS4 may be elongated in the second direction D2 and disposed on the first active region A1, the second active region A2, and the isolation structure IS. In addition, the fourth gate structure GS4 may be located between the first gate structure GS1 and the third gate structure GS3 in the first direction D1. In some embodiments, the first gate structure GS1, the second gate structure GS2, the third gate structure GS3, and the fourth gate structure GS4 may be formed concurrently by the same manufacturing process and have the same composition, the same width, and equal spacing, but not limited thereto. The fourth gate contact structure GC4 may be partially disposed on and electrically connected with the fourth gate structure GS4. In some embodiments, the fourth gate contact structure GC4, the first gate contact structure GC1, and the second gate contact structure GC2 may be formed concurrently by the same manufacturing process, and the compositions of the first gate contact structure GC1, the second gate contact structure GC2, and the fourth gate contact structure GC4 may be identical to one another, but not limited thereto.

In addition, the semiconductor device 103 in this embodiment may include three second slot contact structures SC2 disposed between the first gate structure GS1 and the fourth gate structure GS4, between the fourth gate structure GS4 and the third gate structure GS3, and between the second gate structure GS2 and the third gate structure GS3 respectively, and the semiconductor device 103 may include three third slot contact structures SC3 disposed between the first gate structure GS1 and the fourth gate structure GS4, between the fourth gate structure GS4 and the third gate structure GS3, and between the second gate structure GS2 and the third gate structure GS3 respectively, but not limited thereto. The dielectric layer 40 in this embodiment may be disposed on the first gate contact structure GC1, the second gate contact structure GC2, the third gate contact structures GC3, the fourth gate contact structure GC4, the first slot contact structure SC1, the second slot contact structures SC2, and the third slot contact structures SC3. The opening V6 may penetrate the dielectric layer 40 on the fourth gate contact structure GC4 and expose a part of the fourth gate contact structure GC4, and the opening V7 may penetrate the dielectric layer 40 on the first slot contact structure SC1 and expose a part of the first slot contact structure SC1. In addition, the conductive line L6, the conductive line L7, and the conductive line L8 may be disposed on the dielectric layer 40 and elongated in the first direction D1 respectively. A portion of the conductive line L6 may be disposed on the fourth gate contact structure GC4, and the conductive line L6 may be electrically connected with the fourth gate contact structure GC4 via the opening V6. Additionally, another portion of the conductive line L6 may be disposed on the second gate contact structure GC2, and the conductive line L6 may be electrically connected with the second gate contact structure GC2 via the opening V2. In other words, the second gate structure GS2 and the fourth gate structure GS4 may be electrically connected with each other by the second gate contact structure GC2, the conductive line L6, and the fourth gate contact structure GC4. The conductive line L7 may be electrically connected with the first slot contact structure SC1 and the second slot contact structure SC2 via the opening V3 and the opening V4 respectively, and the first slot contact structure SC1 may be electrically connected with one of the second slot contact structures SC2 by the conductive line L7 accordingly. The conductive line L8 may be partially disposed on the first slot contact structure SC1 located on the second active region A2, and the conductive line L8 may be electrically connected with the first slot contact structure SC1 via the opening V7. The conductive line L1, the conductive line L6, the conductive line L7, the conductive line L8, and the dummy conductive lines DL may be formed concurrently by the same manufacturing process, and the compositions of the conductive line L1, the conductive line L6, the conductive line L7, the conductive line L8, and the dummy conductive lines DL may be identical to one another (may be a part of the patterned conductive layer MI respectively, for example), but not limited thereto.

In addition, the semiconductor device 103 in this embodiment may be an inverter, and the layout design of standard cell corresponding to the semiconductor device 103 may be simplified and/or the area occupied by the standard cell may be reduced by disposing the conductive line L1, the conductive line L2, the conductive line L3, the conductive line L4, and the dummy conductive lines DL elongated in the same direction and disposing the first gate contact structure GC1 and the second gate contact structure GC2 at the two opposite sides of the first slot contact structure SC1.

Figure 13:
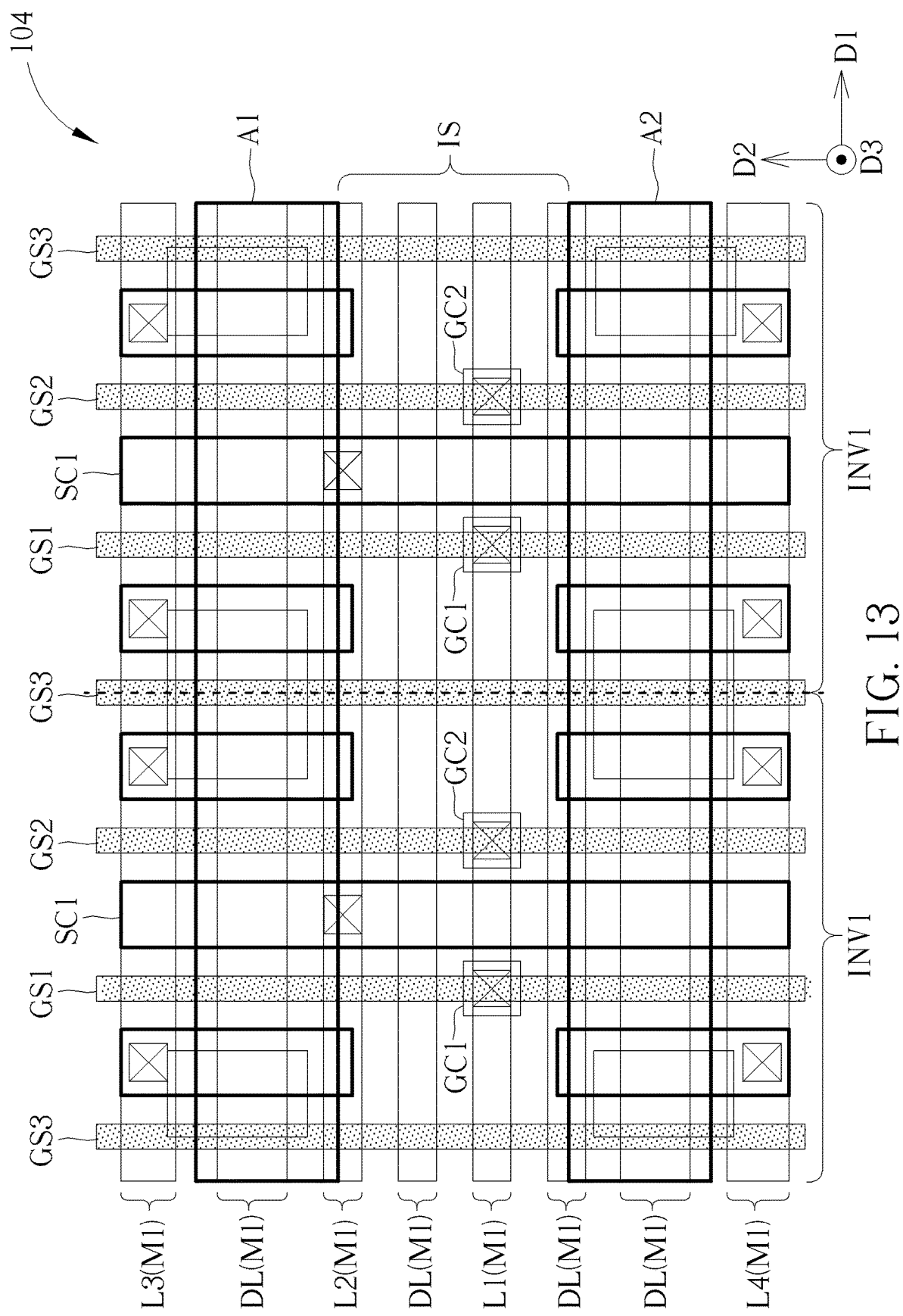
FIG. 13 is a schematic drawing illustrating a semiconductor device according to a fourth embodiment of the present invention.

Please refer to FIG. 13 and FIG. 1. FIG. 13 is a schematic drawing illustrating a semiconductor device 104 according to a fourth embodiment of the present invention. As shown in FIG. 13 and FIG. 1, the semiconductor device 104 in this embodiment may include a plurality of the first inverters INV1 connected with one another for composing a ring oscillator. For example, two or more first inverters INV1 may be arranged in the first direction D1, one of the third gate structures GS3 may be shared by the first inverters INV1 adjacent to each other, and the first active region A1, the second active region A2, the conductive line L1, the conductive line L2, the conductive line L3, the conductive line L4, and the dummy conductive lines DL may be shared by the first inverters INV1 repeatedly disposed in the first direction D1 for forming the ring oscillator. In other words, the first inverter INV1 may be regarded as a part of the ring oscillator shown in FIG. 13, but the present invention is not limited to this. In some embodiments, the first inverter INV1 may also be used to form a semiconductor structure with other functions.

Figure 14:
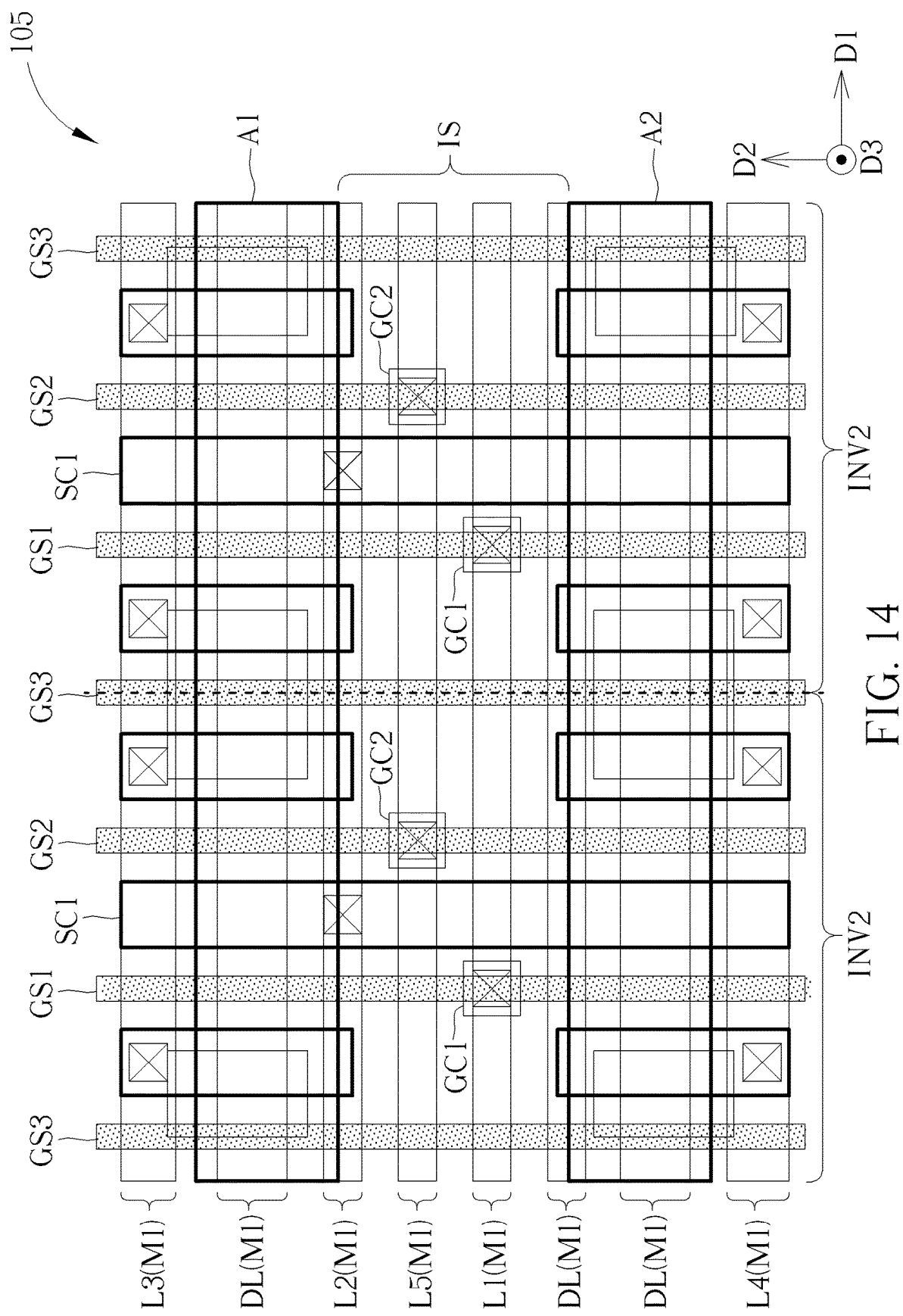
FIG. 14 is a schematic drawing illustrating a semiconductor device according to a fifth embodiment of the present invention.

Please refer to FIG. 14 and FIG. 7. FIG. 14 is a schematic drawing illustrating a semiconductor device 105 according to a fifth embodiment of the present invention. As shown in FIG. 14 and FIG. 7, the semiconductor device 105 in this embodiment may include a plurality of the second inverters INV2 connected with one another for composing a ring oscillator. Two or more second inverters INV2 may be arranged in the first direction D1, one of the third gate structures GS3 may be shared by the second inverters INV2 adjacent to each other, and the first active region A1, the second active region A2, the conductive line L1, the conductive line L2, the conductive line L3, the conductive line L4, the conductive line L5, and the dummy conductive lines DL may be shared by the second inverters INV2 repeatedly disposed in the first direction D1 for forming the ring oscillator.

To summarize the above descriptions, according to the semiconductor device in the present invention, the gate contact structures may be disposed adjacent to the slot contact structure connected with different source/drain regions for simplifying the layout design of the standard cell corresponding to the semiconductor device and/or reducing the area occupied by the standard cell. Additionally, the conductive lines corresponding to the gate contact structures and the slot contact structures in the standard cell may be accordingly elongated in the same direction for simplifying the layout design, and the area occupied by the standard cell may be further reduced because a multiple patterning process may be used to form the conductive lines with smaller spacing therebetween.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a substrate comprising:
a first active region elongated in a first direction; and
a second active region elongated in the first direction;
an isolation structure disposed between the first active region and the second active region;
a first gate structure continuously elongated in a second direction and disposed on the first active region, the second active region, and the isolation structure;
a second gate structure continuously elongated in the second direction and disposed on the first active region, the second active region, and the isolation structure;
a first source/drain region disposed in the first active region located between the first gate structure and the second gate structure;
a first slot contact structure continuously elongated in the second direction and disposed between the first gate structure and the second gate structure in the first direction, wherein the first slot contact structure is disposed on the first active region, the second active region, and the isolation structure, and the first slot contact structure is electrically connected with the first source/drain region;
a second source/drain region disposed in the first active region, wherein the first source/drain region and the second source/drain region are located at two opposite sides of the first gate structure in the first direction respectively; and
a second slot contact structure elongated in the second direction and at least partially disposed on the first active region, wherein the second slot contact structure is electrically connected with the second source/drain region, and a length of the second slot contact structure in the second direction is less than a length of the first slot contact structure in the second direction,
wherein a part of the second slot contact structure is disposed above the isolation structure in a thickness direction of the substrate.

2. The semiconductor device according to claim 1, wherein the second direction is orthogonal to the first direction.

3. The semiconductor device according to claim 1, further comprising:
a third source/drain region disposed in the second active region located between the first gate structure and the second gate structure, wherein the first slot contact structure is electrically connected with the third source/drain region, and the first source/drain region is electrically connected with the third source/drain region via the first slot contact structure.

4. The semiconductor device according to claim 3, further comprising:
a fourth source/drain region disposed in the second active region, wherein the third source/drain region and the fourth source/drain region are located at the two opposite sides of the first gate structure in the first direction respectively; and
a third slot contact structure elongated in the second direction and at least partially disposed on the second active region, wherein the third slot contact structure is electrically connected with the fourth source/drain region, and a length of the third slot contact structure in the second direction is less than the length of the first slot contact structure in the second direction.

5. The semiconductor device according to claim 1, further comprising:

a first gate contact structure disposed on and electrically connected with the first gate structure; and
a second gate contact structure disposed on and electrically connected with the second gate structure, wherein the first gate contact structure and the second gate contact structure are disposed at two opposite sides of the first slot contact structure in the first direction respectively.

6. The semiconductor device according to claim 5, wherein the first gate contact structure and the second gate contact structure are disposed between the first active region and the second active region in the second direction, and the first gate contact structure and the second gate contact structure do not overlap the first active region and the second active region in the thickness direction of the substrate.

7. The semiconductor device according to claim 5, wherein the first gate contact structure and the second gate contact structure are disposed above the isolation structure, and there is not any active region disposed between the first active region and the second active region.

8. The semiconductor device according to claim 5, wherein a length of the first gate contact structure in the second direction and a length of the second gate contact structure in the second direction are less than a length of the isolation structure in the second direction.

9. The semiconductor device according to claim 5, wherein the length of the first gate contact structure in the second direction is equal to a length of the first gate contact structure in the first direction, and the length of the second gate contact structure in the second direction is equal to a length of the second gate contact structure in the first direction.

10. A semiconductor device, comprising:
a substrate comprising:
a first active region elongated in a first direction; and
a second active region elongated in the first direction;
an isolation structure disposed between the first active region and the second active region;
a first gate structure continuously elongated in a second direction and disposed on the first active region, the second active region, and the isolation structure;
a second gate structure continuously elongated in the second direction and disposed on the first active region, the second active region, and the isolation structure;
a slot contact structure continuously elongated in the second direction and disposed between the first gate structure and the second gate structure in the first direction, wherein the slot contact structure is disposed on the first active region, the second active region, and the isolation structure;
a first gate contact structure disposed on and electrically connected with the first gate structure;
a second gate contact structure disposed on and electrically connected with the second gate structure, wherein the first gate contact structure and the second gate contact structure are disposed at two opposite sides of the slot contact structure in the first direction respectively;
a dielectric layer disposed above the first gate contact structure, the second gate contact structure, and the slot contact structure in a thickness direction of the substrate;
a first opening penetrating the dielectric layer above the first gate contact structure in the thickness direction of the substrate and exposing a part of the first gate contact structure;
a second opening penetrating the dielectric layer above the second gate contact structure in the thickness direction of the substrate and exposing a part of the second gate contact structure; and
a first conductive line disposed on the dielectric layer and elongated in the first direction, wherein a part of the first conductive line is disposed on the first gate contact structure, and the first conductive line is electrically connected with the first gate contact structure via the first opening.

11. The semiconductor device according to claim 10, wherein the second direction is orthogonal to the first direction.

12. The semiconductor device according to claim 10, wherein another part of the first conductive line is disposed on the second gate contact structure, the first conductive line is electrically connected with the second gate contact structure via the second opening, and the first gate structure is electrically connected with the second gate structure by the first gate contact structure, the first conductive line, and the second gate contact structure.

13. The semiconductor device according to claim 10, further comprising:
a second conductive line disposed on the dielectric layer and elongated in the first direction, wherein a part of the second conductive line is disposed on the second gate contact structure, and the second conductive line is electrically connected with the second gate contact structure via the second opening.

14. The semiconductor device according to claim 13, wherein a length of the first gate contact structure in the second direction and a length of the second gate contact structure in the second direction are less than a pitch between the first conductive line and the second conductive line in the second direction.

15. The semiconductor device according to claim 14, wherein the pitch between the first conductive line and the second conductive line in the second direction is equal to a sum of a spacing between the first conductive line and the second conductive line in the second direction and a width of the first conductive line or a sum of the spacing between the first conductive line and the second conductive line in the second direction and a width of the second conductive line.

16. The semiconductor device according to claim 10, wherein the first gate contact structure and the second gate contact structure are disposed between the first active region and the second active region in the second direction, and the first gate contact structure and the second gate contact structure do not overlap the first active region and the second active region in the thickness direction of the substrate.

17. The semiconductor device according to claim 10, wherein the first gate contact structure and the second gate contact structure are disposed above the isolation structure, and there is not any active region disposed between the first active region and the second active region.

18. The semiconductor device according to claim 10, wherein a length of the first gate contact structure in the second direction and a length of the second gate contact structure in the second direction are less than a length of the isolation structure in the second direction.

19. The semiconductor device according to claim 18, wherein the length of the first gate contact structure in the second direction is equal to a length of the first gate contact structure in the first direction, and the length of the second gate contact structure in the second direction is equal to a length of the second gate contact structure in the first direction.

* * * * *